(12) United States Patent
Van Haren et al.

(10) Patent No.: US 8,722,179 B2
(45) Date of Patent: May 13, 2014

(54) SUBSTRATE COMPRISING A MARK

(75) Inventors: Richard Johannes Franciscus Van Haren, Waalre (NL); Bartolomeus Petrus Rijpers, Nuenen (NL); Harminder Singh, Avondale, AZ (US); Gerald Arthur Finken, Woodbury, MN (US)

(73) Assignee: ASML Netherlands B.V., Veldhoven (NL)

( * ) Notice: Subject to any disclaimer, the term of this patent is extended or adjusted under 35 U.S.C. 154(b) by 763 days.

(21) Appl. No.: 11/637,215

(22) Filed: Dec. 12, 2006

(65) Prior Publication Data

US 2008/0138623 A1   Jun. 12, 2008

(51) Int. Cl.
*B32B 7/02* (2006.01)
*H01L 23/544* (2006.01)

(52) U.S. Cl.
USPC ........... 428/213; 428/212; 428/698; 428/702; 428/704; 257/797

(58) Field of Classification Search
None
See application file for complete search history.

(56) References Cited

U.S. PATENT DOCUMENTS

| | | | | |
|---|---|---|---|---|
| 3,563,809 | A * | 2/1971 | Wilson | 438/514 |
| 5,217,916 | A * | 6/1993 | Anderson et al. | 438/128 |
| 5,406,373 | A * | 4/1995 | Kamon | 356/401 |
| 5,468,580 | A | 11/1995 | Tanaka | |
| 5,601,957 | A * | 2/1997 | Mizutani et al. | 430/22 |
| 6,143,622 | A * | 11/2000 | Yamamoto et al. | 438/401 |
| 6,368,937 | B1 * | 4/2002 | Nakamura | 438/401 |
| 6,376,924 | B1 * | 4/2002 | Tomita et al. | 257/797 |
| 6,440,262 | B1 | 8/2002 | Minami et al. | |
| 6,440,816 | B1 | 8/2002 | Farrow et al. | |
| 6,455,212 | B1 * | 9/2002 | Honeycutt et al. | 430/22 |
| 6,534,378 | B1 * | 3/2003 | Ramkumar et al. | 438/401 |
| 6,888,260 | B2 | 5/2005 | Carpi et al. | |
| 7,271,073 | B2 | 9/2007 | Van Haren et al. | |
| 7,442,624 | B2 | 10/2008 | Sarma et al. | |
| 2001/0028457 | A1 | 10/2001 | Matsuura | |
| 2002/0028528 | A1 | 3/2002 | Ohtaka | |
| 2003/0026471 | A1 * | 2/2003 | Adel et al. | 382/144 |

(Continued)

FOREIGN PATENT DOCUMENTS

| | | | |
|---|---|---|---|
| JP | 62-097327 A | 5/1987 |
| JP | 2003-234272 A | 8/2003 |
| JP | 2006-019738 A | 1/2006 |

OTHER PUBLICATIONS

Sheerin. Backyard Mosaics, Sterling Publishing Company, Inc., 2002, pp. 82-83.*

(Continued)

*Primary Examiner* — Prashant J Khatri
(74) *Attorney, Agent, or Firm* — Sterne, Kessler, Goldstein & Fox P.L.L.C

(57) ABSTRACT

A substrate comprises a first mark and a second mark. The first mark comprises a first pattern with at least one mark feature formed by a first material and at least one further region formed by a second material. The first and second materials have different material characteristics with respect to a chemical-mechanical polishing process such that a step height in a direction substantially perpendicular to the surface of the substrate may be created by applying the chemical-mechanical polishing process. The second mark can be provided with a second step height by applying the chemical-mechanical polishing process. The second step height is substantially different from the first step height.

18 Claims, 9 Drawing Sheets

(56) References Cited

U.S. PATENT DOCUMENTS

| | | |
|---|---|---|
| 2003/0164353 A1 | 9/2003 | Tsubata |
| 2004/0262783 A1* | 12/2004 | Ido et al. ........................ 257/797 |
| 2005/0189502 A1* | 9/2005 | Van Bilsen et al. ........ 250/559.3 |
| 2005/0276465 A1 | 12/2005 | Chen |
| 2006/0017180 A1 | 1/2006 | Sarma |
| 2006/0279004 A1 | 12/2006 | Suehira et al. |
| 2008/0212057 A1 | 9/2008 | Van Haren et al. |

OTHER PUBLICATIONS

English-Language Translation of Notification of Reason(s) for Refusal directed to related Japanese Patent Application No. 2007-318469, mailed Oct. 18, 2011, from the Japanese Patent Office; 4 pages.

Non-Final Office Action directed to related U.S. Appl. No. 12/000,452, filed Dec. 12, 2007, mailed Jan. 9, 2012; 10 pages.

Non-Final Rejection mailed Dec. 28, 2012 for U.S. Appl. No. 12/000,452, filed Dec. 12, 2007; 7 pages.

Notice of Allowance mailed Aug. 12, 2013 for U.S. Appl. No. 12/000,452, filed Dec. 12, 2007; 6 pages.

Final Rejection mailed Jun. 21, 2012 for U.S. Appl. No. 12/000,452, filed Dec. 12, 2007; 11 pages.

* cited by examiner

SUBSTRATE COMPRISING A MARK

FIELD

The present invention relates to a substrate comprising a mark.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During the process of creating a plurality of patterned layers on a substrate, a layer may cover a mark created in an underlying layer, such that this mark can no longer be used for alignment purposes. The mark may be covered with a layer that is opaque for the alignment tool used.

SUMMARY

It is desirable to provide a solution that allows the use of marks in a layer covered by an opaque layer.

According to an embodiment, there is provided a substrate comprising a first mark on a surface of the substrate, the first mark comprising a first pattern comprising at least one mark feature formed by a first material and at least one further region formed by a second material, the first and second materials having different material characteristics with respect to a chemical-mechanical polishing process such that a step height in a direction substantially perpendicular to the surface of the substrate may be created between the at least one mark feature and the at least one further region by applying the chemical-mechanical polishing process, wherein the substrate further comprises a second mark comprising at least one mark feature of the second mark and at least one further region of the second mark formed adjacent to the at least one mark feature of the second mark, such that a second step height in a direction substantially perpendicular to the surface of the substrate may be created between the at least one mark feature of the second mark and the at least one further region of the second mark by applying the chemical-mechanical polishing process, where the second step height is substantially different from the first step height.

According to a further aspect, there is provided a pair of marks formed on a substrate, comprising a first mark and a second mark, the first mark comprising a first pattern comprising at least one mark feature formed by a first material and at least one further region formed by a second material, the first and second materials having different material characteristics with respect to a chemical-mechanical polishing process such that a step height in a direction substantially perpendicular to the surface of the substrate may be created between the at least one mark feature and the at least one further region by applying the chemical-mechanical polishing process, wherein the second mark comprises at least a mark feature of the second mark and at least one further region of the second mark formed adjacent to the at least one mark feature of the second mark, such that a second step height in a direction substantially perpendicular to the surface of the substrate may be created between the at least one mark feature of the second mark and the at least one further region of the second mark by applying the chemical-mechanical polishing process, where the second step height is substantially different from the first step height.

According to a further embodiment, there is provided a patterning device for generating a pair of marks as described above.

According to a further embodiment, there is provided a lithographic projection apparatus arranged to project a pattern from a patterning device onto a substrate, wherein the patterning device comprises patterns corresponding to a first mark and a second mark according to the above.

According to a further embodiment, there is provided a device manufactured using the apparatus according to the above.

According to a further embodiment, there is provided a device manufacturing method comprising projecting a patterned beam of radiation onto a substrate, wherein the patterning device comprises patterns corresponding to a first mark and a second mark according to the above.

According to a further embodiment, there is provided a device manufacturing method comprising transferring a pattern from a patterning device onto a substrate, wherein the patterning device comprises patterns corresponding to a first mark and a second mark according to the above.

According to a further embodiment, there is provided a device manufactured according to the methods according to the above.

According to a further embodiment, there is provided a method for determining a position of a mark provided on a substrate, comprising:
  providing a substrate comprising a first mark and a second mark according to the above,
  providing an alignment sensor,
  performing at least a first measurement using the alignment sensor for the first mark, wherein, the method further comprises:
  determining whether the first measurement was successful, and, if not, further performing:
  a second measurement using the alignment sensor for the second mark.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
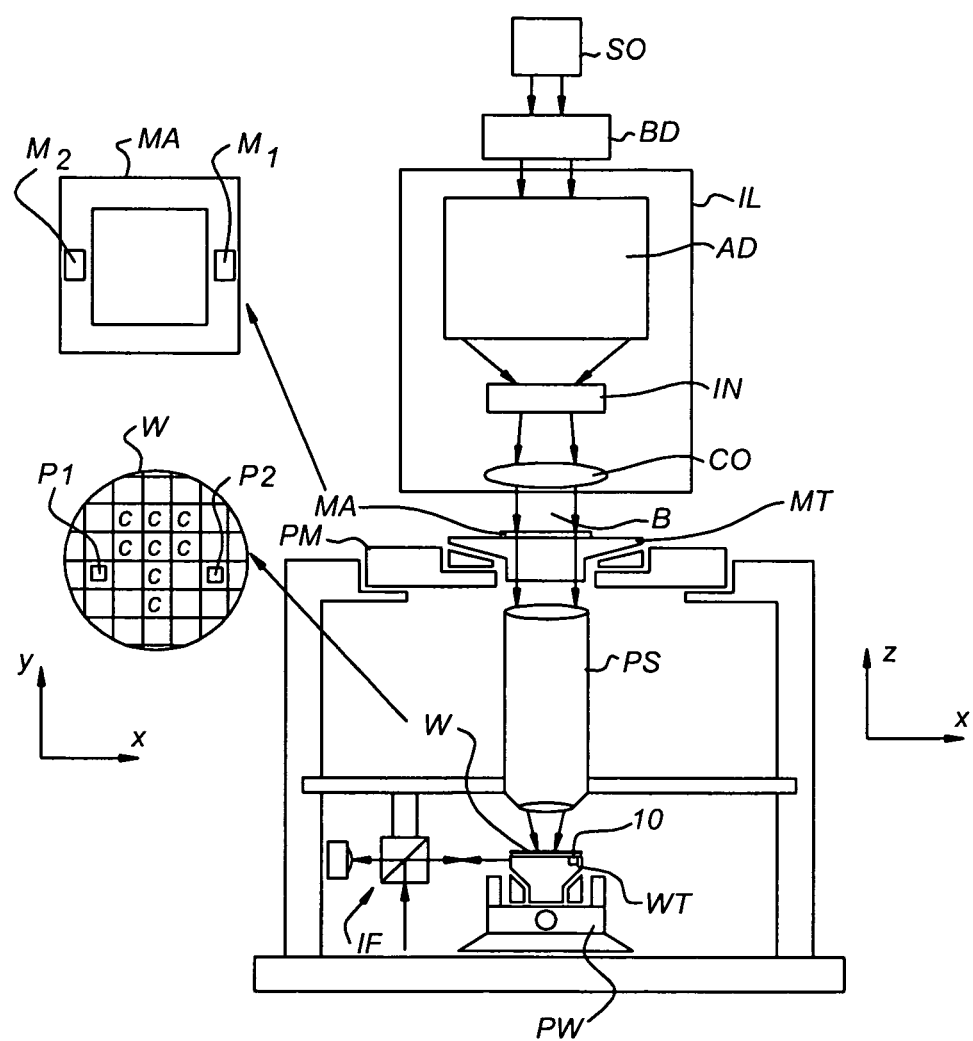
FIG. 1 schematically depicts a lithographic apparatus.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual-stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device.

Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

By repeatedly depositing layers and projecting patterns to a target portion C of the deposited layer on the substrate W and performing post-exposure processing steps, such as post-exposure bakes, chemical-mechanical polishing (CMP), a number of different layers with different characteristics may be created on the substrate W. The different layers may together form a product, as for instance a memory comprising a plurality of transistors. Since the different layers of such a product interact with each other, all layers should be aligned with respect to each other.

In order to achieve optimal alignment, (alignment) marks are created on the substrate W, for instance during the first exposure. The marks may be used for positioning the substrate W with respect to the projection system PS during a next exposure action. The marks may be created in so-called scribe lanes along the edge of a target portion C. Marks may comprise a number of mark lines ML forming a pattern.

The substrate W may be positioned accurately with respect to the projection system PS by accurately measuring the position of the marks using an alignment system. If necessary, the relative position of the substrate W with respect to the projection system PS may be adjusted. An example of an alignment sensor is discussed in the next paragraph.

Alignment Sensor

The exemplary alignment sensor measures a position of an alignment mark. During alignment, the alignment mark is illuminated with an alignment beam of radiation. The alignment beam of radiation is diffracted by the alignment mark into several diffraction orders such as +1, −1, +2 and −2. Using optical elements, each set of corresponding diffraction orders (say +1 and −1) is used to form an image of the alignment mark onto a reference plate. The reference plate comprises reference gratings for each set of corresponding diffraction orders to be measured. Behind each reference grating, a separate detector is arranged to measure the intensity of the radiation in the image passing through the reference gratings. By moving the alignment mark relative to the reference plate, the position with the highest intensity for one or more images is found, which gives the aligned position.

To enhance performance, the intensity of several images can be measured and the alignment beam of radiation can consist of multiple colors (wavelengths).

It will be understood that also other suitable alignment sensors may be used.

Figure 2:
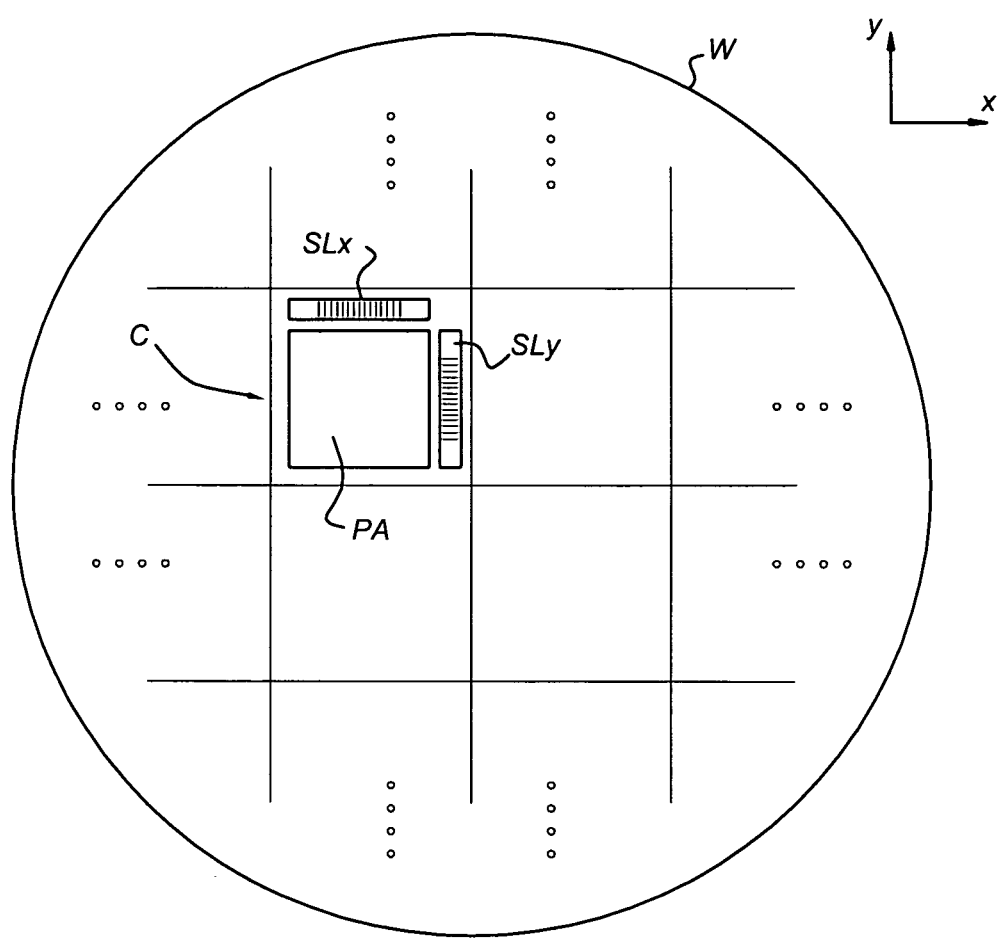
FIG. 2 schematically depicts a substrate.

FIG. 2 schematically depicts a substrate W comprising a number of target portions C, of which one is depicted in more detail. The target portion C comprises a product area PA, i.e. an area in which the functionality of the final product is created, a first scribe lane SLx in the x-direction and a second scribe lane SLy in the y-direction, where the x- and y-directions are substantially perpendicular with respect to each other, and substantially parallel with the surface of the substrate W. The first and second scribe lane SLx, SLy both comprise marks for alignment in the x-direction and y-direction, respectively.

The product area PA may for instance be used to create a plurality of transistors forming a memory product. In such a manufacturing process, in a first exposure, a pattern is projected on the substrate W to create trenches to isolate the different transistors to be created from each other. In this same exposure, marks are created in the scribe lanes SLx, SLy.

Figure 3:
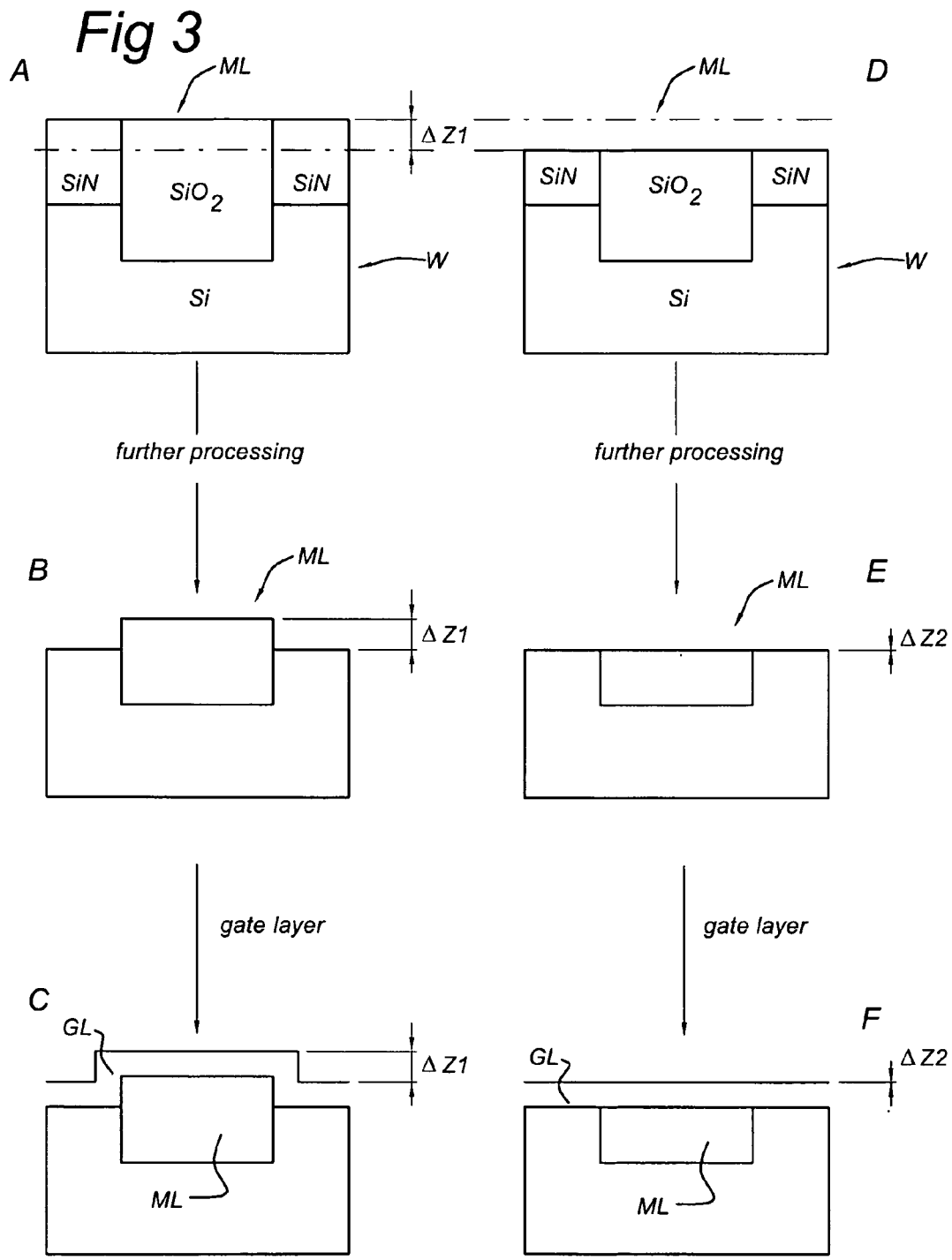
FIG. 3 schematically depicts cross-sectional views of part of a substrate in different situations during processing.

FIG. 3 schematically depicts a situation A in which a cross-sectional view of part of such a scribe lane, depicting part of a mark, i.e. a mark line ML formed by silicon-oxide $SiO_2$, embedded in silicon-nitride SiN. FIG. 3 for instance shows a cross-sectional view in the x-direction of the first scribe lane SLx, showing part of a mark created in the scribe lane SLx. Situation A of FIG. 3 shows one period of a periodic mark, e.g. an alignment grating. Such a period may be formed by a mark line ML and a further region. In general, the mark may be formed by a plurality of mark features, such as mark lines ML and further regions adjacent to the mark features.

An action prior to situation A of FIG. 3 is a chemical mechanical polishing process (CMP-process CMP1), i.e. an oxide CMP-process. The CMP-process results in situation A of FIG. 3. Due to process fluctuations of the CMP-process, the height of the $SiO_2$ with respect to the Si-substrate W is not fixed. Normal process fluctuations of the CMP-process result in a distribution of different heights, as will be described in more detail below. Situation D in FIG. 3 schematically depicts a similar situation as situation A of FIG. 3, in which the $SiO_2$ has a different height with respect to the Si-substrate.

Further substrate processing, starting from situation A and D, leads to situations B and E, respectively. During the removal of the Nitride layer (wet etch), some of the $SiO_2$ is removed as well. During ion-implantation steps more $SiO_2$ is removed. Also, substrate cleaning steps (HydrogenFluoride dips) remove some of the $SiO_2$. Prior to gate stack deposition, the cross-sections may appear as shown in situations B and E of FIG. 3. The step height difference between situations B and E was already created in situation A and D.

In a further processing action, a gate layer GL is deposited to form the gates of the transistors in the product area. However, the gate layer GL usually covers the entire surface of the substrate W, including the scribe lanes SLx, SLy. The added gate layer GL is schematically shown in situation C of FIG. 3. According to specific applications, the gate layer GL is an opaque layer (e.g. comprising metal), so the alignment beam of radiation of the alignment sensor can no longer directly 'see' the mark line ML.

The term opaque is used here to indicate that a layer is non-transparent for the radiation used by the alignment sensor. In case of metals, the gate stack is highly reflective. This, in combination with the absence of topography, leads to the situation that diffraction (and thus alignment) is impossible.

The gate layer exposure is a critical exposure and is the one addressed here. As described earlier, there may be some further processing actions in between (ion-implantation steps). However, the mark looks like the one shown in situation B. This is a mark having a high contrast, so no problems are expected, even when covered by an opaque layer, such as a gate layer. The gate layer may consist of a dielectric, usually a thin layer of Silicon-Oxide (also for instance Hafnium Oxide), a poly-Si layer, a tungsten layer and a SiN layer. Different gate stacks are also possible. Also, metal gates may be used.

As can be seen in situations B and C of FIG. 3, the mark line ML is not level but rises above the underlying Silicon-layer Si, creating a first step height $\Delta z1$, which is also present in the gate layer GL. The step height $\Delta z1$ is depicted in situations B and C of FIG. 3. This topology can now be used by the alignment sensor to perform alignment measurements, as the topology also diffracts an alignment beam of radiation into several diffraction orders. So, despite the fact that the mark is covered by an opaque layer, the mark may still be used for alignment using an alignment beam.

It is known that the effect of the CMP-process may be different for different areas on the surface. For instance, the effect of the CMP-process may be different towards the edge of the substrate W compared to the center of the substrate W, due to different movements of a CMP pad with respect to parts of the substrate W.

However, other reasons may be identified explaining why a CMP process has different effects for different areas on the surface. These differences may for instance be caused by differences in pattern density, differences in end-point detection (detection of when the polishing process is finished), different CMP-tools (or CMP heads within the CMP tool), polish slurry, polish pad (hard pad or soft pad), force applied to polish the substrate, etc. These differences may result in situation D of FIG. 3 instead of situation A.

Figure 4:
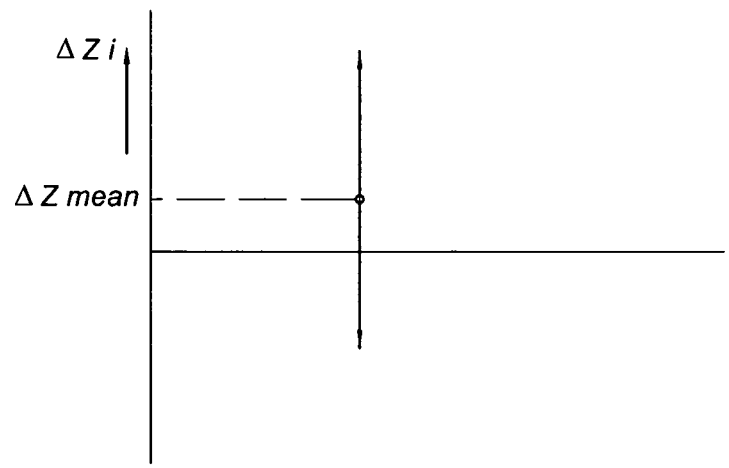
FIGS. 4 and 5 schematically depict distributions in step heights, FIG. 6 schematically depicts cross-sectional views of part of a substrate in different situations during processing.

As a result of process fluctuations of the CMP-process described above, the step height $\Delta zi$ ($i=1, 2, 3, \ldots$) for different target portions C of the substrate W varies around a mean value $\Delta z_{mean}$. This is schematically depicted in FIG. 4, showing a possible distribution of the step height $\Delta z$ between different target portions C of a same substrate W. It is noted that according to the distribution, some step heights $\Delta z_i$ may become zero or even negative.

In situation D of FIG. 3, the effect is shown of a second CMP-process CMP2, for instance, being the same CMP-process as mentioned for situation A, but performed on a different part of the substrate W. Situation D of FIG. 3 shows that this second CMP-process CMP2 results in a mark line ML that is even with its surroundings, i.e. the mark line ML does not rise above the underlying Silicon-layer Si, thus creating a second step $\Delta z2$ height substantially equal to zero: $\Delta z2 \approx 0$, as shown in situation E of FIG. 3. When, in a further action, the gate layer GL is added, being an opaque layer, the mark line ML can no longer be used for alignment, as it is no longer directly visible to the alignment beam of the alignment sensor, and furthermore, no topology is present: the gate layer GL is now substantially flat, as shown in situation F of FIG. 3.

The fluctuations of the CMP-process can be such that an alignment mark has a contrast value of zero or close to zero for (at least) part of a distribution. This leads to rejected marks or, even worse, a rejection of the substrate W. The mean value of the contrast can be changed by selecting another mark type, however, the problem may not disappear. The reason is that for the new mark type another part of the distribution will have little or no contrast. Changing the mark type may solve the problem at one location, but may introduce the problem at an other location. The CMP-process may also vary from substrate to substrate.

To solve the problem of 'invisible' marks, the alignment mark may be repaired by performing an additional repair action. However, this is associated with extra lithography actions and/or processing actions and thus associated with a reduced throughput and extra costs.

The problem described above is described with reference to the example of creating a plurality of transistors by first creating trenches and marks, which are at a later stage covered with an opaque layer. However, it will be understood that this problem may also occur in different situations. In fact, this problem may occur in all sorts of situations where a mark is created that is at a later stage covered with an opaque layer.

Embodiments

According to an embodiment of the present invention, a first mark M1 and a second mark M2 are created, being a complementary pair of marks M1, M2. The first mark M1 differs from the second mark M2 so as to create an offset in (one of) the mark properties. A complementary pair of marks M1, M2 may be provided in both the x-direction and the y-direction. In the embodiments below, only one direction is described.

Figure 5:
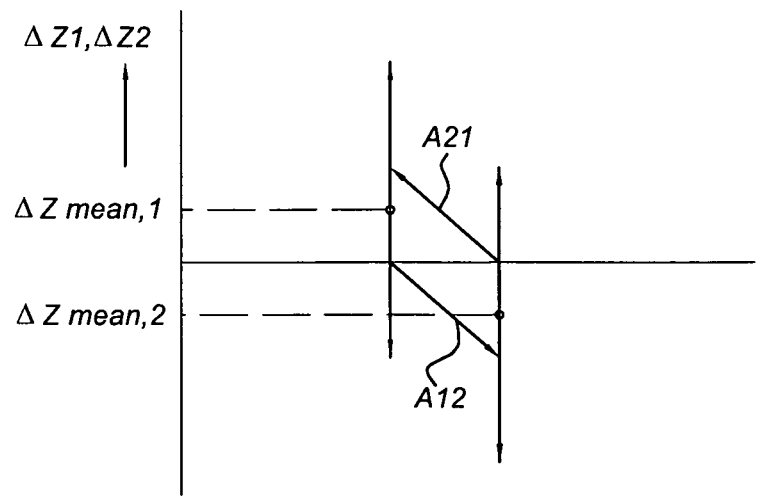

FIG. 5 schematically depicts a possible distribution of the step height $\Delta z$ of the first mark M1 and the second mark M2. As shown, the step height $\Delta z$ of the first mark M1 varies around a mean value $\Delta z_{mean,1}$. This is schematically depicted in FIG. 5, showing a possible distribution of the step height $\Delta z$ among different target portions C. FIG. 5 further schematically depicts a distribution of the step height $\Delta z$ of the second mark M2. As shown, the step height $\Delta z$ of the second mark M2 also varies, in this case around a mean value $\Delta z_{mean,2}$. As can be seen in FIG. 5, the mean value of the first mark M1 $\Delta z_{mean,1}$ is substantially different from the mean value of the second mark M2 $\Delta z_{mean,2}$: $\Delta z_{mean,1} \neq \Delta z_{mean,2}$.

Providing a complementary pair of marks M1, M2 ensures that the step height $\Delta z$ of at least one of the first mark M1 or the second mark M2 is substantially different from zero. The step height (phase depth) of the complementary pair of marks M1, M2 may be used to ensure that detection occurs. The step height difference is based on a difference in mark design and/or the way in which the mark is processed in previous layers. This and further examples are explained below.

It is important to note that the mark step height distribution could be on a single substrate or multiple substrates. This implies that any combination of alignment mark A or B distributed across the substrate or from substrate to substrate can be used for alignment. So far, CMP-process fluctuations are described occurring within a substrate W. However, the same concept may also be applied to address substrate-to-substrate fluctuations, e.g. substrate 1 Mark A, substrate 2 Mark B, substrate 3 Mark B, substrate 4 mark A, etc.

Measurements of the alignment sensor may in principle be performed on the first mark M1. If it is detected that the step height of the first mark M1 is substantially zero and no alignment measurements can be performed after applying the opaque layer, the alignment sensor may be arranged to switch to the second mark M2 and start performing alignment measurements on the second mark M2. In case the first mark M1 has a step height substantially equal to zero, the second mark M2 has a step height substantially not equal to zero. This switch from the first to the second mark is schematically depicted in FIG. 5 with arrow $A_{21}$.

The alignment sensor may now be arranged to continue performing measurements on the second mark M2, until it is detected that the step height of the second mark M2 is substantially zero and no alignment measurements can be performed after applying the opaque layer. The alignment sensor may be arranged to switch to the first mark M1 and start performing alignment measurements on the first mark M1, which in this case has a step, height substantially not equal to zero. This switch from the second to the first mark is schematically depicted in FIG. 5 with arrow $A_{21}$.

The above provides a method of automatically switching between using the first and the second marks M1, M2. This method ensures that alignment measurements are always performed on an alignment mark that allows correct alignment measurements to be performed.

However, according to an alternative, it is also possible to perform measurements on first and second marks M1, M2, store the measurement results, and determine at a later moment which measurements to use. It will be understood that other variations are conceivable.

It will be understood that many different ways for creating a complementary pair of marks M1, M2 can be conceived, of which some will be discussed here.

Mark Lay-out 1

The offset difference between the first mark M1 and the second mark M2 may be induced by the mark layout itself, e.g. by creating a difference in pattern density, which in combination with a CMP-process leads to a step height difference between the first and the second mark M1, M2. The resistance to CMP-processes of a pattern is related to the relative amount of the materials in the pattern.

According to the example described above with reference to FIG. 3, the mark comprises mark lines ML made of $SiO_2$ embedded in a layer of SiN. The mark may typically comprise 50% of $SiO_2$ and 50% of SiN. By changing this ratio the step height $\Delta z$ may be influenced, as will be explained.

Figure 6:
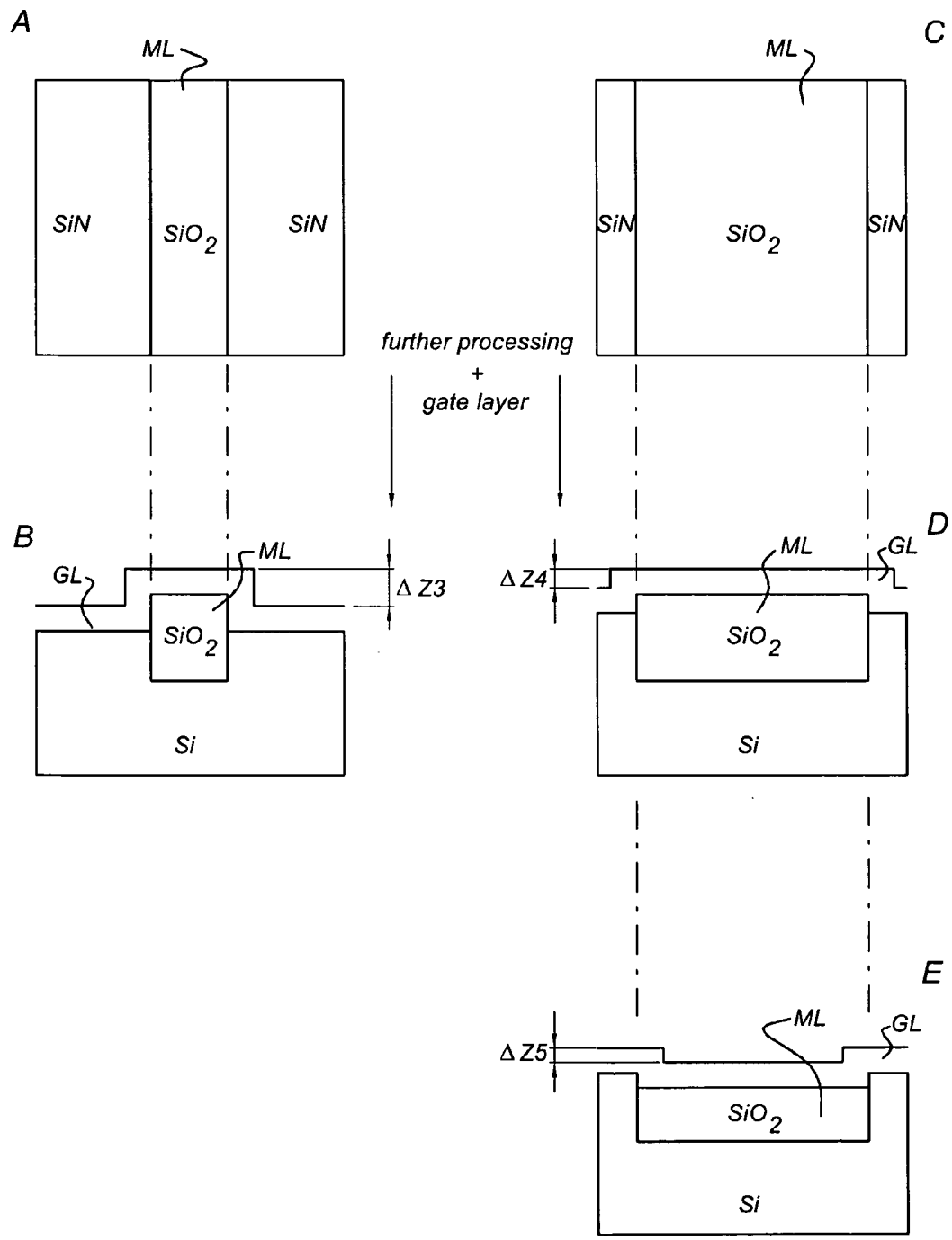

FIG. 6 schematically depicts a situation A in which a top view of a mark line ML comprises $SiO_2$ surrounded at least partially by SiN, where the $SiO_2$ forms 25% of the area. The mark line ML may be part of the first mark M1. After performing a CMP-process and applying a gate layer GL, this results in a step height $\Delta z3$, as shown in situation B of FIG. 6.

FIG. 6 also schematically depicts a situation C in which a top view of a mark line ML comprises $SiO_2$ surrounded at least partially by SiN, where the $SiO_2$ forms 75% of the area. The mark line ML may be part of the second mark M2. After performing a CMP-process and applying a gate layer GL, this results in a step height $\Delta z4$, as shown in situation D of FIG. 6, FIG. 6 clearly shows that $\Delta z3 > \Delta z4$.

This embodiment makes use of the fact that different materials provide different resistances to the CMP-process, i.e., the speed at which the CMP-process removes the layer depends on the material and the amounts (relative area) of the specific materials, i.e., the line width. The CMP-process is applied as long as necessary to remove the Silicon-Oxide layer. In the example provided here, the Nitride-layer provides a relatively high resistance, while the Silicon Oxide-layer provides a relatively low resistance.

So, in situations A and B of FIG. 6, the $SiO_2$-content is 25%, providing a relatively high resistance. As a result, the SiliconOxide-layer is removed relatively easily by the CMP-process (low resistance). The oxide CMP step is applied to remove the redundant $SiO_2$. The SiN layer is used as a CMP stopping layer, as will be understood by a skilled person. The CMP-process only needs to be applied to remove the redundant $SiO_2$, leaving a relatively high step height $\Delta z3$.

In situations C and D, the $SiO_2$-content is 75%, providing a relatively low resistance. Since this (mark) area contains more $SiO_2$, the oxide removal rate is higher. In both situations, some of the SiN is also removed by the polishing process. However, less is removed in situation A than in situation C. This results in: $\Delta z3 > \Delta z4$. As a result, the SiN-layer in situation C is removed with relatively more difficulty by the CMP-process (high resistance), leaving a relatively low step height $\Delta z4$.

In fact, the step height may also become negative ($\Delta z5$), as schematically depicted in situation E of FIG. 6. It will be understood that the step height will not become negative as a result of the CMP-process (prior to situations A and C of FIG. 6), but as a result of further processing, such as nitride strip, ion implantation etc.

It will be understood that a ratio of 25%-$SiO_2$/75% SiN in the first mark M1 versus a ratio of 75%-$SiO_2$/25% SiN in the second mark M2 is only an example. In order to increase the difference in the step height $\Delta z3$ and $\Delta z4$, other percentages may be chosen. It will be understood that higher ratios of $SiO_2$/SiN may be chosen to further increase the step height, but that increased ratios also decrease the diffraction efficiencies.

By changing the ratio of the different materials used in the first mark M1 and the second mark M2, a complementary pair of marks M1, M2 is created, that result in a different step height after the CMP-process. It will be understood that the complementary pair of marks M1, M2 may have similar patterns, where for instance the two materials used in the first mark M1 are also used in the second mark M2, where in the second mark M2 the first material is used for areas where the second material is used in the first mark M1, and vice versa. This ensures that similar diffraction orders are created. However, it will be understood that the complementary pair of marks M1, M2 may also be formed such that different diffraction orders are created.

However, increasing/decreasing the line widths of the first and second mark M1, M2 respectively, also results in a decrease in the quality of the diffraction orders created by the alignment beam, i.e. it results in a decrease in the light intensity of the diffraction orders. It will be understood that the light intensity of the diffraction order is best for a duty cycle of 50%.

However, depositing the gate layer GL may increase the duty cycle. For instance, in situation B of FIG. 6, the thickness of the gate layer GL causes a shift in the duty cycle with respect to the printed duty cycle as shown in situation A. The thickness of the gate layer GL itself causes an increase of the duty cycle.

In FIG. 6, the alignment mark has a printed duty cycle of 25% (situation A). After gate stack deposition, the duty cycle shifts toward 50% (situation B).

The same happens to the mark in situation C (75% printed duty cycle). In case of a negative step height (situation E), the duty cycle shifts toward 50% after deposition of the gate layer GL.

Treatment

According to a further embodiment, a complementary pair of marks M1, M2 may be created by treating the first mark M1 differently with respect to the second mark M2 during the processing of the substrate W. As a result, the materials of the two marks may obtain different material characteristics with respect to a chemical-mechanical polishing process such that a step height in a direction substantially perpendicular to the surface of the substrate may be created in the one mark which differs from a step height in the other mark.

For instance, the first mark M1 may not be treated, while the second mark M2 is treated, for instance implanted with Phosphorous or Boron. This results in a different step height for the first mark M1 as compared to the second mark M2. Of course, the goal is to increase the step height difference between the first mark M1 and the second mark M2.

According to this example, the second mark M2 (i.e. the $SiO_2$-rich mark) gets ions implanted. This process damages the $SiO_2$, and therefore the $SiO_2$ will be removed faster during the subsequent wet etch (meant to remove the sacrificial $SiO_2$ that is needed to do the ion implantation). Hence, the step height difference between M1 and M2 is increased. The ion implantation trick may be applied in addition to the other embodiments described here, in which different effects of the CMP-process are used. It will be understood that the ion implantation is only an example. Indeed, all further processing and lithographic steps in between the oxide CMP-process and the gate layer deposition (or gate stack deposition) should be considered candidates to enhance the topography difference between the first and the second marks M1, M2.

Mark Lay-out 2

As is known to a skilled person, the techniques for performing CMP-processes are constantly improving. As a result, the difference between the step height $\Delta z3$ of a situation with 25% $SiO_2$ and the step height $\Delta z4$ of a situation with 75% $SiO_2$ becomes smaller, as the CMP-process is less influenced by the resistance of the materials. In fact, the difference between the step height $\Delta z3$ of a situation with 25% $SiO_2$ and the step height $\Delta z4$ of a situation with 75% $SiO_2$ may become substantially zero, making it impossible to use the first mark M1 or the second mark M2 for alignment after the opaque layer is applied.

In situations with advanced trench oxide CMP-processes and tungsten (or metal)-containing gate layer stacks, solutions based on modifications of the duty cycle of the alignment mark (as described above) to create topography at gate layer exposure may fail. The induced topography as a result of the oxide-CMP may be too small to create a robust alignment mark.

This may be solved by choosing extreme duty cycles, for instance choosing 15%-$SiO_2$/85% SiN in the first mark M1 versus a ratio of 85%-$SiO_2$/15% SiN in the second mark M2. However, as already described above, these percentages can not be increased and decreased respectively without suffering adverse effects. By choosing percentages closer to 100% and 0% respectively, the line widths of the first and second mark are decreased, reducing the light intensity of a diffracted alignment beam, resulting in a decrease of the alignment quality.

The application of extreme duty cycles (<10% or >90%) may help to create topography differences inside the alignment mark. However, the diffraction efficiencies may become too low to use the mark for alignment.

As described above, a mark repair action can be performed when all other solutions fail. Prior to the gate layer deposition, the trench oxide is etched back to create sufficient topography at gate layer exposure. However, this requires an extra litho and etching step which makes this solution expensive.

According to this embodiment, the topology is enhanced, while preserving the original mark layout. Mark lay-outs are proposed that allow a further increase and decrease of the percentages of $SiO_2$ and SiN respectively, without decreasing the quality of the alignment measurement.

Figure 7A:
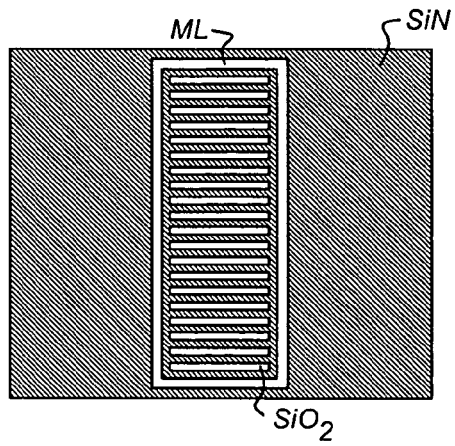
FIGS. 7a, 7b, 7c, 7d schematically depict mark according to different embodiments.
Figure 7B:
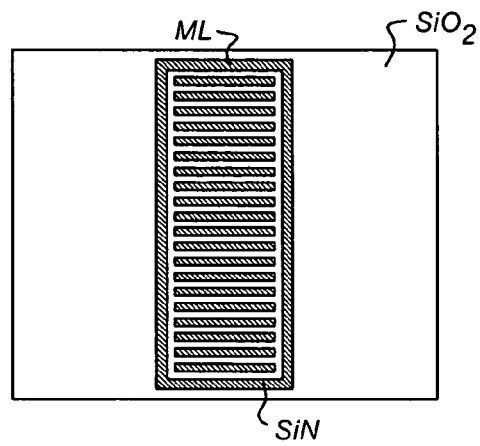

FIG. 7a shows a mark line ML of a first mark M1 and FIG. 7b shows a mark line ML of a second mark M2, the first and second marks M1, M2 forming a complementary pair of marks. As can be seen in FIGS. 7a and 7b, the $SiO_2$ content has been further reduced/decreased by slicing each mark line ML.

The term "slicing", is used here to refer to dividing an area in a first direction in first and second areas formed by a first and a second material respectively, where the first and second areas are alternatingly positioned adjacent with respect to each other. Instead of the term slicing, the term 1D sub-segmentation or sub-segmentation in one dimension may be used.

The $SiO_2$ content of the first mark M1 is approximately 12.86%, and the $SiO_2$ content of the second mark M2 is approximately 87.14%. However, as a result of the slicing, the original mark layout, i.e. the contour of the mark line, is preserved, after the gate layer (or gate stack) has been deposited—that is, when a substrate alignment needs to be performed before exposure.

Figure 7C:
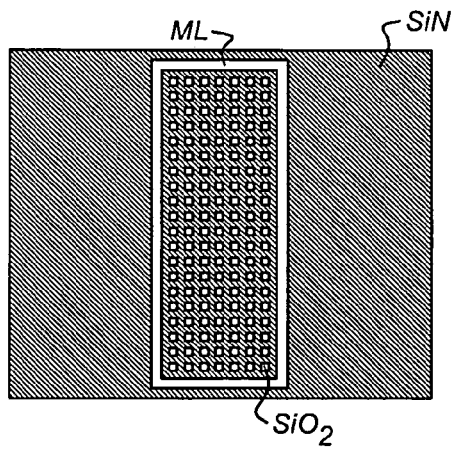
Figure 7D:
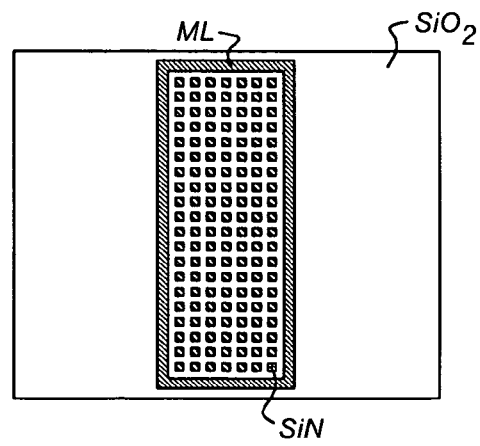

FIGS. 7c and 7d show an embodiment in which a further increase and decrease of the percentages of $SiO_2$ and SiN are obtained, without further decreasing the quality of the alignment measurements. FIG. 7c shows a mark line ML of a first mark M1 and FIG. 7d shows a mark line. ML of a second mark M2, the first and second marks M1, M2 forming a complementary pair of marks. As can be seen in FIGS. 7c and 7d, the $SiO_2$ content has been further reduced/decreased by dicing each mark line ML. The $SiO_2$ content of the first mark M1 is approximately 8.75%, and the $SiO_2$ content of the second mark M2 is approximately 91.25%. However, as a result of the dicing, the original mark layout, i.e. the contour of the mark line, is preserved, after the gate layer (or gate stack) has been deposited—that is, when a substrate alignment needs to be performed before exposure.

The term dicing is used here to refer to slicing an area in a first and a second area, i.e. dividing an area in a first and second direction leaving separated areas of a first material, surrounded by a second area of a second material. Instead of the term dicing, the term 2D sub-segmentation or sub-segmentation in two dimensions may be used.

By further reducing/increasing the $SiO_2$ content of the complementary pair of marks M1, M2, the difference in step height $\Delta z$ after the CMP-process between the first and second mark is further increased, ensuring that quality measurements can be performed at least at one of the first mark M1 and the second mark M2.

The effect of slicing and dicing of the mark lines ML as described above is explained with reference to FIG. 8.

Figure 8:
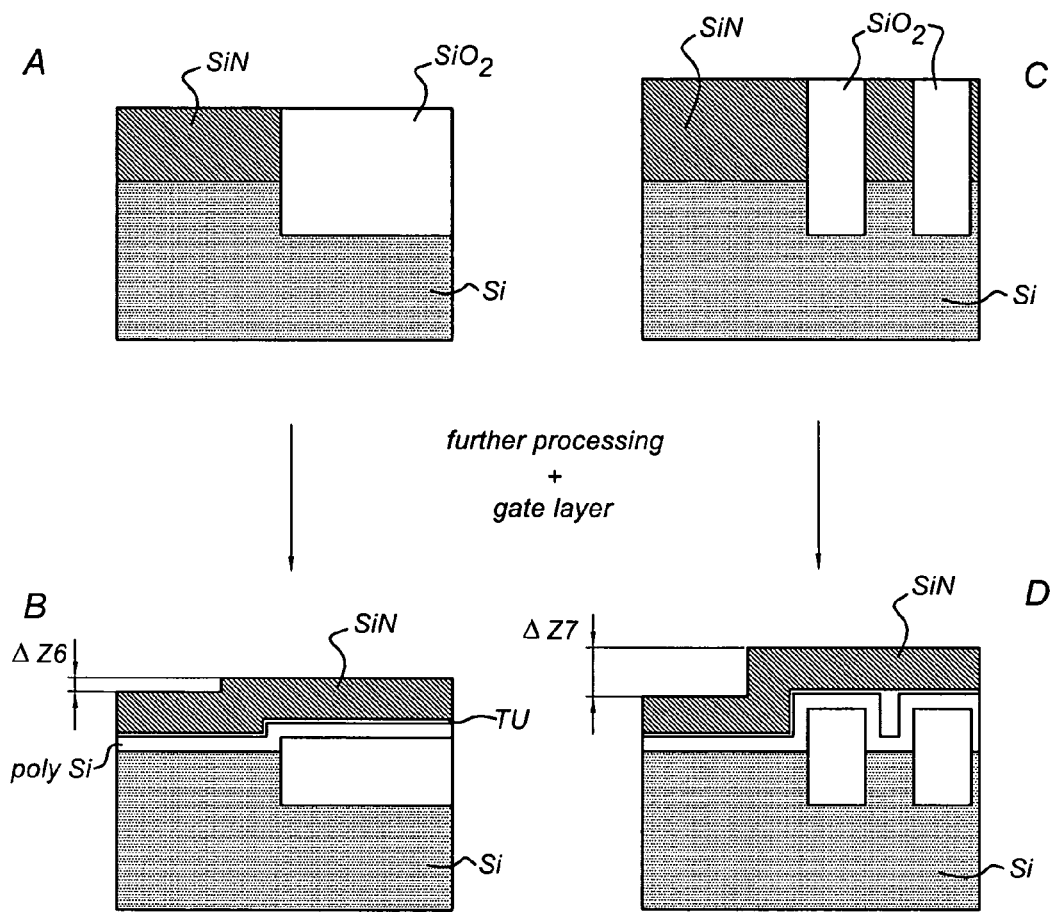
FIG. 8 schematically depicts further cross-sectional views of part of a substrate in different situations during processing.

FIG. 8 schematically depicts a situation A, showing a cross sectional view of a part of a mark. Situation A of FIG. 8 shows one period of a periodic mark, e.g. an alignment grating. Such a period may be a mark line ML and a further region, as already described above. Situation A of FIG. 8 depicts the situation after applying the CMP process of a transition between a mark feature (Siliconoxide) and a further region (Silicon Nitride). The mark line ML has not been sliced or diced. Situation B in FIG. 8 schematically depicts the situation after performing the further processing and applying the opaque gate layer GL. In the above embodiments, the gate layer GL was shown as a single layer. However, according to an embodiment, the gate layer GL comprises of a plurality of layers, e.g. a first poly-Si layer, a Tungsten layer TU, and a Silicon-Nitride layer SiN. This results in a relatively small step height $\Delta z6$, which may be too small for a robust alignment signal.

Situations C and D of FIG. 8 schematically depict the effect of slicing (or dicing) the mark line M1. As described above, the original space of the alignment mark design is sub-divided into smaller spaces.

Situation C shows that the mark line ML has been sliced in two parts, where the part in between the slices is filled with SiN. Since the total amount of $SiO_2$ has been reduced with respect to situation A, the resistance for the CMP-process has been increased, leaving a higher step height $\Delta z7$, already present in situation C. It is noted that the poly-Si layer is deposited, following the contour of the slice. Next, the Tungsten layer TU is deposited to fill the slice. Finally, the Silicon-Nitride layer SiN is deposited to complete the gate layer GL.

According to an embodiment, the poly-Si layer and the Tungsten layer are thick enough to completely fill the slice in between the two $SiO_2$ parts. If this is the case, the original mark lay out (unsliced or undiced mark layout) is preserved. However, although the mark layout is preserved, the step height is increased or decreased after the CMP step due to the increased Nitride contents in the first mark M1 or increased due to the Silicon-Oxide contents in the second mark M2. This way, a complementary pair of marks M1, M2 may be created that both have substantially different step heights.

The above described embodiment allows a further increase of the difference in step height between two complementary marks M1 and M2, without introducing low signal strength problems of the alignment sensor described above. The spaces in between the slices and dices are typically less than 100 nm. These mark designs become feasible together with the 65-nm, 45-nm imaging nodes, and beyond.

The proposed marks contain sub-segmentation that meets the future product design specifications. The pattern density of one mark as printed may be increased to the level of 90%, while the pattern density of the complementary mark design can be brought below 10%. This ensures very high sensitivity to the trench oxide CMP process.

After processing, i.e. applying an opaque layer, the marks resemble a standard non-segmented mark, yet they exhibit an enhanced topography.

The above provides a method to modify the ratio between the content of Oxide and Nitride inside a FEOL alignment mark (FEOL: Front End Of Line). As a result, extreme pattern densities (<10% or >90%) can be designed while maintaining the underlying mark layouts. Therefore, the CMP effect (topology differences) between the complementary mark designs can be maximized.

Although the idea is presented with respect to a mark comprising $SiO_2$ and SiN, it will be understood that the idea of slicing and dicing may also be used at other process layers where CMP is applied.

Mark Switching

The switching between the first and the second mark M1, M2 may for instance be based on the diffraction efficiency, a grid residual, order-to-order offset, etc. This will be explained in the following paragraphs.

The diffraction efficiency or the signal strength of the diffraction orders, may be used to distinguish good marks (situation C of FIG. 3) from the bad marks (situation F of FIG. 3).

Order-to-order offset, or color-to-color offsets may also be used to switch between the first and the second mark M1, M2. Two colors may be used for alignment, both providing an aligned position. In case of a well defined mark, like in situation C of FIG. 3, these positions are the same. The color-to-color difference will be zero in that case. In case of a mark having no topography (like in situation F of FIG. 3) noise is picked up by the alignment sensor. The color-to-color aligned position differences are expected to be high (and noisy) in that situation. This may be used for mark selection.

The same may be used when considering the aligned position resulting from two diffraction orders arising from the same mark . . . If the aligned position as determined based on a first diffraction order is substantially different from an aligned position as determined based on a second diffraction order, it may be concluded that the mark used for the measurements is of a low quality, and the position determination was unsuccessful. This may also be used for mark selection.

By scanning an alignment mark, a position is obtained. By combining all alignment mark data, a coordinate system (or reference grid) can be constructed. The deviations from the measured alignment marks with respect to this modeled grid are called grid residuals. This may be used for mark selection, as the mark may be used that generates the smallest grid residuals.

Flow Diagram

It will be understood that the complementary pair of marks as described above may be used for alignment purposed and the like. Therefore, measurements may be performed on one of the first or the second mark. In case no successful alignment can be performed (due to a step height $\Delta z \approx 0$), a second measurement may be performed on the other mark of the complementary pair of marks.

Figure 9:
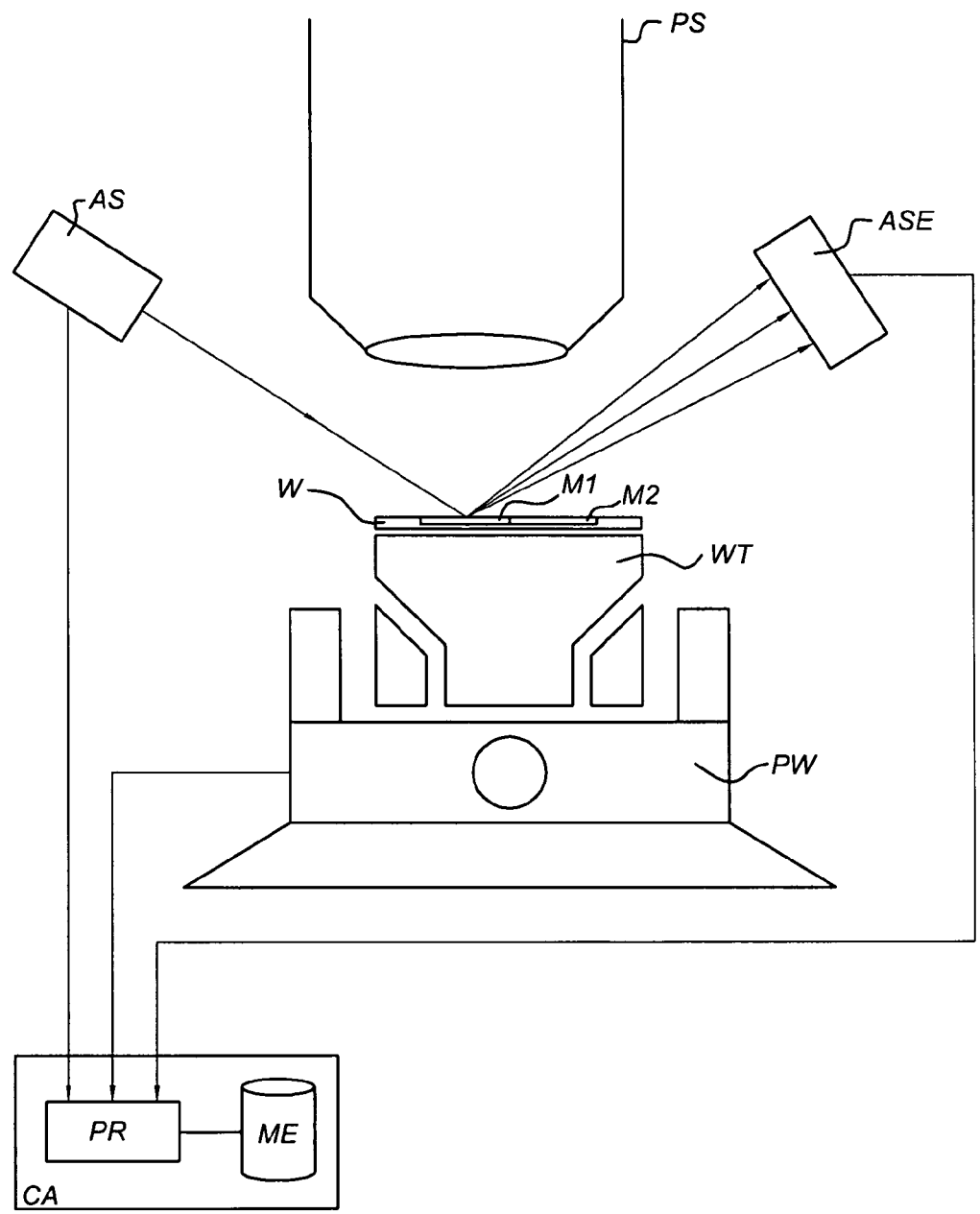
FIG. 9 schematically depicts a part of a lithographic apparatus according to an embodiment.

The methods described above may all be carried out by a computer arrangement CA comprising a processor PR for executing computer programs and/or performing arithmetical operations, and computer-readable medium, such as a memory ME. This is schematically depicted in FIG. 9, which shows part of a lithographic apparatus now further comprising the processor PR being arranged to communicate with memory ME. Memory ME may be any type of memory arranged to store instructions and data, such as a tape unit 13, hard disk 14, a Read Only Memory (ROM) 15, Electrically Erasable Programmable Read Only Memory (EEPROM) 16 and a Random Access Memory (RAM) 17.

FIG. 9 further depicts the alignment sensor as described above, comprising an alignment sensor arranged to measure a position of an alignment mark. The alignment sensor comprises an alignment beam source AS and an alignment sensing element ASE, comprising a reference plate and optical elements used to form an image of corresponding diffraction orders (say +1 and −1) of the alignment mark onto the reference plate.

The processor PR may be arranged to read and execute programming lines stored in a computer-readable medium, such as memory ME, to provide the processor PR with the functionality to perform the methods described above. In order to be able to perform these methods, the processor PR may be arranged to control the position of the substrate table WT and to receive information from the alignment sensor described above. The processor PR may be specially configured to perform one or more of the described embodiments, but may also be a central processor arranged to control the lithographic apparatus as a whole and now being provided with additional functionality to perform one or more of the described embodiments.

It should be understood that there may be provided more and/or other units, such as memory units, input devices and read devices known to persons skilled in the art. Moreover, one or more of them may be physically located remotely from the processor PR, if required. The processor PR is shown as one box. However, it may comprise several processing units functioning in parallel or controlled by one main processor PR that may be located remotely from one another, as is known to persons skilled in the art.

It is observed that, although all connections in FIG. 9 are shown as physical connections, one or more of these connections can be made wireless. They are only intended to show that "connected" units are arranged to communicate with one another in some way. The computer system can be any signal processing system with analog and/or digital and/or software technology arranged to perform the functions discussed here.

Figure 10:
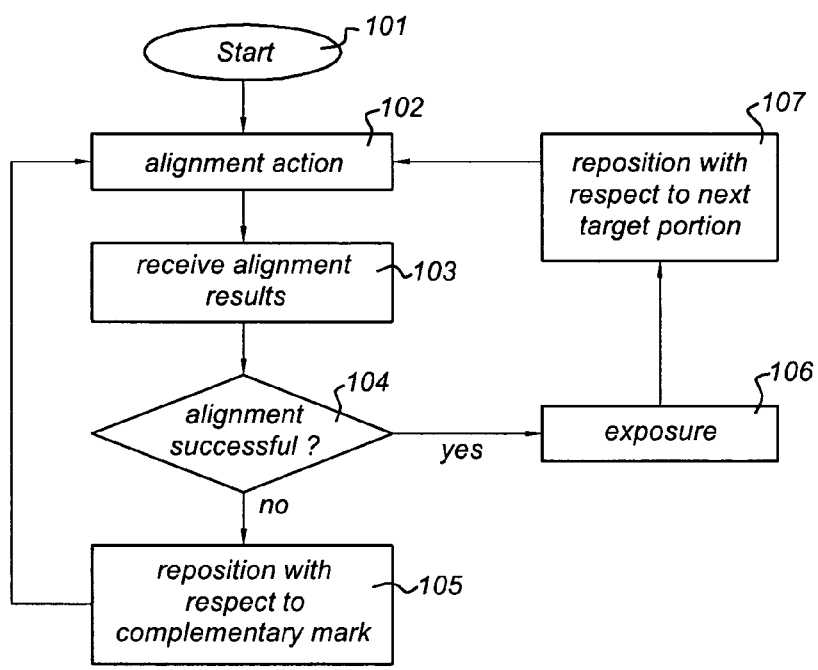
FIG. 10 schematically depicts a flow diagram according to an embodiment.

With reference to FIG. 10, the computer arrangement CA may be arranged to perform the following actions:

In a first action 101, the alignment process is started. In a next action 102, the computer arrangement CA may control the alignment sensor, i.e. the alignment beam source AS and the alignment sensor element ASE 101 to perform an alignment action, for instance with respect to the first mark M1 of a complementary pair of marks M1, M2 associated with a target portion C. Next, in action 103, the computer arrangement CA may receive alignment results of the alignment action performed in action 102 from the alignment sensor ASE.

In action 104, the computer arrangement CA checks based on the alignment results whether or not the alignment action of action 102 has been successful. In case the alignment action of action 102 was not successful, for instance because the first alignment mark M1 is covered by an opaque layer and no topographic features are present, the computer arrangement CA may proceed with an action 105, in which the substrate W is repositioned in order to allow a new alignment action 102 to be executed with respect to the second mark M2 of the complementary pair of marks M1, M2, followed by actions 103 and 104. The repositioning is performed by controlling the second positioner PW configured to accurately position the substrate W.

In case action 104 failed (alignment not successful) the first time, it is expected to succeed (alignment successful) the second time when the alignment is performed with respect to the second alignment mark M2.

After a successful alignment is recognized by the computer arrangement CA in action 104 (based on alignment measurements performed on the first or second alignment mark M1, M2), the computer arrangement CA may continue in action 106 with exposing the target portion C associated with the alignment marks M1, M2 using projection system PS.

After this, the computer arrangement CA may control the second positioner PW configured to accurately position the substrate W in such a way, to allow a new alignment action 102 to be performed with respect to a next target portion C.

According to an embodiment, all marks of a substrate W are measured, including the first and second marks M1, M2 of the complementary pair of marks M1, M2. After all measurements are performed and stored in memory, it may be decided which marks result in successful measurements, and which did not. For each complementary pair of marks M1, M2, the measurement may be used that provided best results, for instance based on diffraction efficiency, a grid residual, order-to-order offset, etc. It will be understood that the flow diagrams as described above may be modified accordingly.

Further Remarks

It will be understood that the embodiments above describe marks of $SiO_2$ and SiN, having different resistances for the CMP-process. However, it will be understood that also any other combination of suitable materials may be used, providing different resistances to the CMP-process. So, in general, the marks may be formed of a first material and a second material, where the first material provides a first resistance to the CMP-process, and the second material provides a second resistance to the CMP-process. The difference in the CMP-resistance between the first and second materials may be obtained by treating the first mark M1 differently with respect to the second mark M2 during the processing of the substrate W, as explained above, for instance by not treating the first mark M1, and implanting the second mark M2 with Phosphorous or Boron. Basically, any litho/processing step in between the definition of the alignment mark and the expose layer of interest can be used. Also, more than one processing step may be used, for instance, a combination of a specific mark design and treatment as described in the above embodiments may be used, as long as all the effects add up to a step height difference between the first and second mark of the complementary pair of marks M1, M2.

In the embodiments described above, the term "mark lines" is used. However, it will be understood that a pattern of a mark may also be formed by other mark features than mark lines. In general, a mark may be formed by a plurality of mark features, e.g. mark lines or any other suitable geometrical shape.

Based on the above embodiments, it will be understood that costly mark repair steps can be avoided when alignment is based on one complementary mark pair. Since the mark designs/treatments are complementary, this offers a robust alignment scenario in cases where alignment to a single mark design would fail.

Also, the idea is not limited to alignment marks; it can also be applied to metrology targets. Apart from process layers for which the contrast of a single alignment mark tends to go to zero, the application might also be of use during a start-up (new chip design, the process is not tuned and the process fluctuations are high) or in situations where the process slowly varies in time. For instance, the CMP tool may drift over time. A user may start with the first mark M1, but may switch to the complementary second mark M2 after a certain period of time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A substrate for lithographic exposure comprising:
   a first lithographic alignment mark on a surface of the lithographic substrate, the first lithographic alignment mark comprising a first lithographic pattern comprising at least one lithographic mark feature formed by a first material and at least one further region formed by a second material, the first and second materials having different material characteristics with respect to a substrate treatment process such that a first step height in a direction substantially perpendicular to the surface of the substrate is created between the at least one lithographic mark feature and the at least one further region by applying the substrate treatment process; and
   a second lithographic alignment mark comprising at least one lithographic mark feature of the second lithographic alignment mark and at least one further region of the second lithographic mark formed adjacent to the at least one lithographic mark feature of the second lithographic alignment mark, such that a second step height in a direction substantially perpendicular to the surface of the substrate is created between the at least one lithographic mark feature of the second lithographic alignment mark and the at least one further region of the second lithographic alignment mark by applying the substrate treatment process, wherein the second step height is substantially different from the first step height,
   wherein either the second lithographic alignment mark comprises a second lithographic pattern having different planar features from planar features of the first lithographic pattern, or the at least one lithographic mark feature of the second lithographic alignment mark is formed by a third material having different material characteristics with respect to the substrate treatment process compared to the first material.

2. The substrate for lithographic exposure according to claim 1, comprising a plurality of target portions, wherein the first and second lithographic alignment marks are both associated with one and the same target portion.

3. The substrate for lithographic exposure according to claim 1, wherein the second lithographic alignment mark comprises the second lithographic pattern formed by the first material forming the at least one lithographic mark feature of the second lithographic alignment mark and the second material forming the at least one further region, the second lithographic pattern having different planar features from planar features of the first lithographic pattern.

4. The substrate for lithographic exposure according to claim 1, wherein the at least one lithographic mark feature of the second lithographic alignment mark is formed by the third material, the third material having different material characteristics with respect to a chemical-mechanical polishing process compared to the first material.

5. The substrate for lithographic exposure according to claim 4, wherein the at least one further region of the second lithographic alignment mark is formed by a fourth material, the fourth material having different material characteristics with respect to the chemical-mechanical polishing process compared to the second material.

6. The substrate for lithographic exposure according to claim 5, wherein at least one of the third and fourth materials is created by applying a treatment to the second lithographic alignment mark.

7. The substrate for lithographic exposure according to claim 4, wherein the third material is created by applying a treatment to the second lithographic alignment mark.

8. The substrate for lithographic exposure according to claim 7, wherein the treatment is one of: implanting phosphorous, implanting boron, or implanting ions.

9. The substrate for lithographic exposure according to claim 1, wherein the first material is Silicon-Oxide.

10. The substrate for lithographic exposure according to claim 1, wherein the second material is Silicon-Nitride.

11. The substrate for lithographic exposure according to claim 1, wherein the at least one lithographic mark feature of the at least one of the first or second lithographic alignment mark is divided into smaller structures.

12. The substrate for lithographic exposure according to claim 11, wherein the smaller structures are sliced structures.

13. The substrate for lithographic exposure according to claim 11, wherein the smaller structures are diced structures.

14. The substrate for lithographic exposure according to claim 1, wherein the substrate treatment process includes a chemical-mechanical polishing process.

15. The arrangement of lithographic alignment marks formed on a substrate for lithographic exposure, comprising a first lithographic alignment mark and a second lithographic alignment mark, the first lithographic alignment mark comprising a first pattern comprising at least one lithographic mark feature formed by a first material and at least one further region formed by a second material, the first and second materials having different material characteristics with respect to a substrate treatment process such that a first step height in a direction substantially perpendicular to a surface of the substrate is created between the at least one lithographic mark feature and the at least one further region by applying the substrate treatment process, wherein the second lithographic alignment mark comprises at least a lithographic mark feature of the second lithographic alignment mark and at least one further region of the second lithographic alignment mark formed adjacent to the at least one alignment mark feature of the second lithographic alignment mark, such that a second step height in a direction substantially perpendicular to the surface of the substrate is created between the at least one lithographic mark feature of the second lithographic alignment mark and the at least one further region of the second lithographic alignment mark by applying the substrate treatment process, wherein the second step height is substantially different from the first step height, wherein either the second lithographic alignment mark comprises a second lithographic pattern having different planar features from planar features of the first lithographic pattern or the at least one lithographic mark feature of the second lithographic alignment mark is formed by a third material having different material characteristics with respect to the substrate treatment process compared to the first material.

16. The arrangement of lithographic alignment marks according to claim 15, wherein the second lithographic alignment mark comprises the second lithographic pattern, the second lithographic pattern having different planar features from planar features of the first lithographic pattern.

17. A patterning device configured to create an arrangement of lithographic alignment marks according to claim 15.

18. The arrangement of lithographic alignment marks according to claim 15, wherein the substrate treatment process includes a chemical-mechanical polishing process.

* * * * *

UNITED STATES PATENT AND TRADEMARK OFFICE
CERTIFICATE OF CORRECTION

| | | |
|---|---|---|
| PATENT NO. | : 8,722,179 B2 | Page 1 of 1 |
| APPLICATION NO. | : 11/637215 | |
| DATED | : May 13, 2014 | |
| INVENTOR(S) | : Van Haren et al. | |

It is certified that error appears in the above-identified patent and that said Letters Patent is hereby corrected as shown below:

In the Claims:

Column 17, line 53, claim 1, please delete "lithographic". (First occurrence)
Column 19, line 1, claim 15, please delete "The" and insert --An--.

Signed and Sealed this
Fourteenth Day of October, 2014

Michelle K. Lee
*Deputy Director of the United States Patent and Trademark Office*